United States Patent [19]
Lee

[11] Patent Number: 5,830,796
[45] Date of Patent: Nov. 3, 1998

[54] METHOD OF MANUFACTURING A SEMICONDUCTOR DEVICE USING TRENCH ISOLATION

[75] Inventor: Kyeong Bock Lee, Kyungki-Do, Rep. of Korea

[73] Assignee: Hyundai Electronics Industries Co., Ltd., Kyungki-Do, Rep. of Korea

[21] Appl. No.: 668,826

[22] Filed: Jun. 24, 1996

[30] Foreign Application Priority Data

Jun. 24, 1995 [KR] Rep. of Korea ................. 1995-17290

[51] Int. Cl.⁶ .................................................. H01L 21/762
[52] U.S. Cl. ........................................... 438/296; 438/430
[58] Field of Search .................................. 438/296, 424, 438/426, 427, 429, 430, 700, 702

[56] References Cited

U.S. PATENT DOCUMENTS

| | | | |
|---|---|---|---|
| 4,661,202 | 4/1987 | Ochii | 438/430 |
| 4,980,306 | 12/1990 | Shimbo | 438/429 |
| 5,387,540 | 2/1995 | Poom et al. | 438/430 |

*Primary Examiner*—Chandra Chaudhari

[57] ABSTRACT

The present invention discloses a method of manufacturing a semiconductor device, comprising the steps of: forming a transistor on a silicon substrate; forming a trench by etching a selected portion of the silicon substrate; and forming an interlayer insulating film on the resulting structure after forming said trench, thereby forming a device isolation film in the trench.

3 Claims, 2 Drawing Sheets

METHOD OF MANUFACTURING A SEMICONDUCTOR DEVICE USING TRENCH ISOLATION

FIELD OF THE INVENTION

The present invention relates to a method of manufacturing a semiconductor device, and more particularly to a method of manufacturing a semiconductor device, which forms a device isolation film after forming a transistor.

BACKGROUND OF THE INVENTION

Generally, in the manufacturing process of a semiconductor device, a transistor is formed after forming a device isolation film. To isolate between an active region and a field region, a field oxide film is widely used, wherein the field oxide film is formed through a LOCOS (Local Oxidation of Silicon) or PBL (Poly Buffered LOCOS) methods. A conventional method of manufacturing the field oxide film, comprising the steps of: forming an oxidation resistance mask on a silicon substrate; growing an oxide film in the silicon substrate through a high temperature oxidation process; and removing the oxidation resistance mask. The above method has a disadvantage in that the active region is reduced due to a bird's beak occurred at the edge portion of the field oxide film. Also, the field oxide film formed by the above method has a high topology. Hence, it is impossible to manufacture a large scale integrated device.

SUMMARY OF THE INVENTION

Accordingly, it is an object of the present invention to provide a method of manufacturing a semiconductor device, which can manufacture a large scale integrated device and improves a process of manufacturing a semiconductor device.

An another object of the invention is to provide a trench-type device isolation film.

To accomplish the above objects, a method of manufacturing a semiconductor device according to the present invention, comprises the steps of: forming a well in a silicon substrate; forming a source region and a drain region in the well; sequentially forming a gate oxide and a gate electrode on the well between the source region and the drain region, thereby forming a transistor; forming a trench by etching a selected portion of the silicon substrate; and forming an interlayer insulating film on the resulting structure after forming the trench thereby forming a device isolation film in the trench.

BRIEF DESCRIPTION OF THE DRAWINGS

For fuller understanding of the nature and objects of the invention, reference should be had to the following detailed description taken in conjunction with the accompanying drawings in which.

Similar reference characters refer to similar parts through the several views of the drawings.

DESCRIPTION OF THE INVENTION

Below, the present invention will be described in detail by reference to the accompanying drawings.

FIG. 1A through FIG. 1E show sectional views of a device for explaining a method of manufacturing a semiconductor device in accordance with the present invention.

Figure 1A:
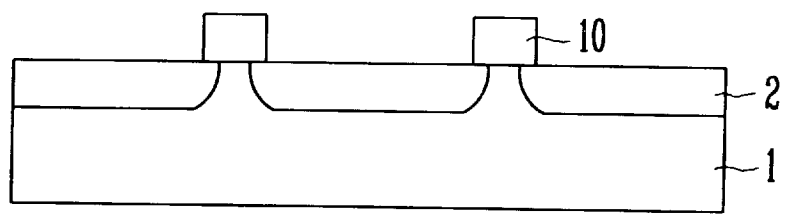
FIG. 1A through FIG. 1E show sectional views of a device for explaining a method of manufacturing a semiconductor device in accordance with the present invention.

Referring to FIG. 1A, a first photoresist pattern 10 is formed on silicon substrate 1. A well 2 is formed in the silicon substrate 1 through an ion implantation process using the first photoresist pattern 10 as a mask.

Figure 1B:
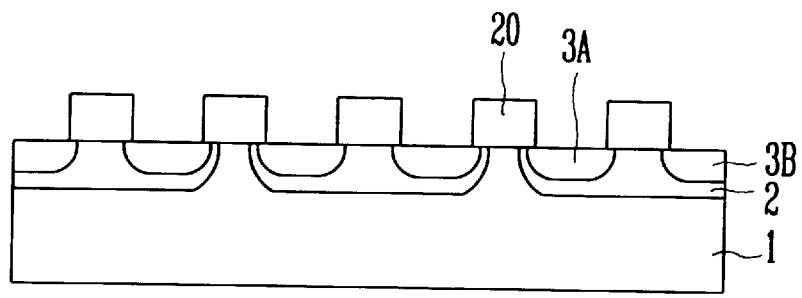

Referring to FIG. 1B, the first photoresist pattern 10 is removed. A second photoresist pattern 20 is then formed on silicon substrate 1 in which the well 2 is formed. Source and drain regions 3A and 3B are formed in the well 2 through an ion implantation process using the second photoresist pattern 20 as a mask.

Figure 1C:
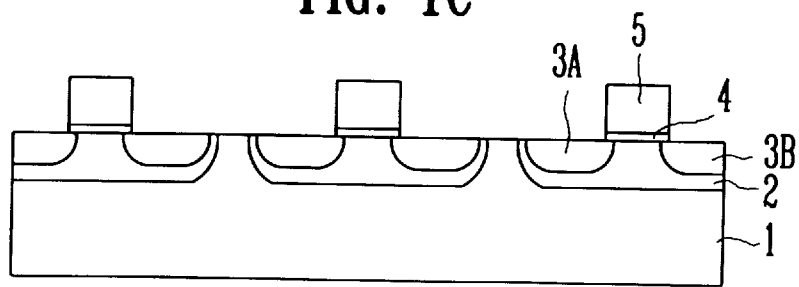

Referring to FIG. 1C, the second photoresist pattern 20 is removed. Gate oxide 4 and gate electrode 5 are then formed over the well 2 between the source region 3A and the drain region 3B by forming an oxide film on the silicon substrate 1 through an oxidation process and forming a polysilicon layer on the oxide film through a polysilicon depositing process and sequentially patterning the polysilicon layer and the oxide film. Thus a transistor having gate electrode 5, source region 3A and drain region 3B is completed.

Figure 1D:
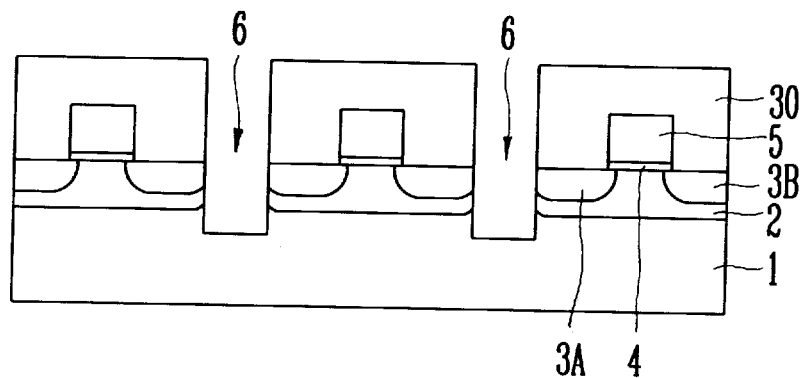

Referring to FIG. 1D, a third photoresist pattern 30 is formed on the silicon substrate 1 in which the transistor is formed. A trench 6 is formed by etching a selected portion of the silicon substrate 1 through an anisotropic etching process using the third photoresist pattern 30 as a mask. The trench 6 is formed in the silicon substrate 1 adjacent the well 2.

In the above, it is possible that the depth and size of the trench 6 can be changed to comply with the characteristics of a particular device.

Figure 1E:
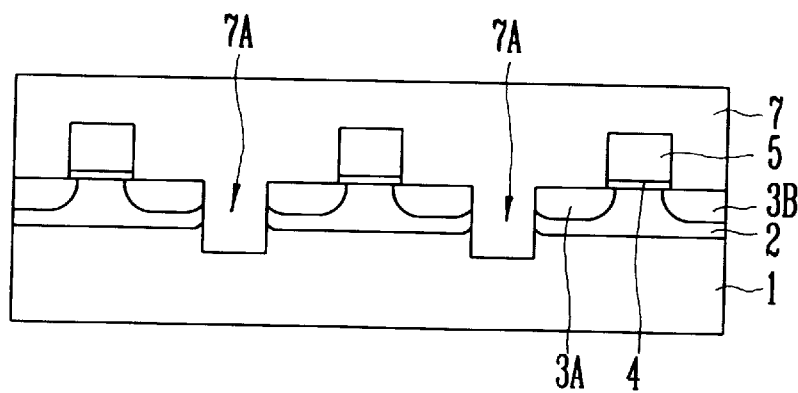

Referring to FIG. 1E, the third photoresist pattern 30 is removed. An interlayer insulating film 7 is then formed on the resulting structure after removing the third photoresist pattern 30, thereby forming a device isolation film 7A in the trench 6.

As mentioned above, the present invention enables the manufacture of a large scale integrated device by forming a trench-type device isolation film and improves the productivity of the device by simultaneously forming an interlayer insulating film and a device isolation film.

The foregoing description, although described in its preferred embodiment with a certain degree of particularity, is only illustrative of the principle of the present invention. It is to be understood that the present invention is not to be limited to the preferred embodiments disclosed and illustrated herein. Accordingly, all expedient variations that may be made within the scope and spirit of the present invention are to be encompassed as further embodiments of the present invention.

What is claimed is:

1. A method of manufacturing a semiconductor device, comprising the steps of:
   forming a plurality of wells in a silicon substrate;
   forming source and drain regions in each of said wells;
   sequentially forming a gate oxide and a gate electrode over each of said wells and source and drain regions, thereby forming a plurality of transistors;
   after forming the plurality of transistors, forming a plurality of trenches by etching selected portions of said silicon substrate; and
   forming an interlayer insulating film on the resulting structure after forming said trenches, thereby forming a device isolation film in each trench.

2. The method of claim 1, wherein said trenches are formed in said silicon substrate adjacent to said wells.

3. The method of claim 1, wherein said trenches are formed by an anisotropic etching process.

* * * * *